(12) United States Patent
Ono (10) Patent No.: US 7,211,878 B2
(45) Date of Patent: May 1, 2007

(54) SEMICONDUCTOR NONVOLATILE MEMORY, METHOD OF RECORDING DATA IN THE SEMICONDUCTOR NONVOLATILE MEMORY AND METHOD OF READING DATA FROM THE SEMICONDUCTOR NONVOLATILE MEMORY

(75) Inventor: Takashi Ono, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 85 days.

(21) Appl. No.: 10/739,215

(22) Filed: Dec. 19, 2003

(65) Prior Publication Data
US 2005/0036366 A1    Feb. 17, 2005

(30) Foreign Application Priority Data
Aug. 14, 2003    (JP)    ............................. 2003-293648

(51) Int. Cl.
*H01L 23/58* (2006.01)
(52) U.S. Cl. .................. 257/645; 257/651; 257/315
(58) Field of Classification Search ............... 257/542, 257/316, 315, 645, 651
See application file for complete search history.

(56) References Cited

U.S. PATENT DOCUMENTS

| 5,408,115 | A | | 4/1995 | Chang |
| 5,969,383 | A | * | 10/1999 | Chang et al. ............... 257/316 |
| 6,069,382 | A | * | 5/2000 | Rahim ......................... 257/316 |
| 6,399,441 | B1 | | 6/2002 | Ogura et al. |
| 6,809,373 | B2 | * | 10/2004 | Nishizaka ................... 257/315 |

* cited by examiner

*Primary Examiner*—Doug Menz
(74) *Attorney, Agent, or Firm*—Volentine & Whitt, P.L.L.C.

(57) ABSTRACT

A memory cell structure and control of the memory operation are simplified, and the cost of production is decreased, by way of a semiconductor nonvolatile memory having a transistor including a gate electrode provided on a p-type semiconductor substrate via a gate insulating film, and a source region and a drain region, which are a pair of n-type impurity diffusion regions in the surface layer region of the semiconductor substrate at positions sandwiching the gate electrodes therebetween. A first resistance-varying portion and a second resistance-varying portion are sandwiched by the source region, drain region and channel-forming region. The n-type impurity concentration in the resistance-varying portions is lower than in the source and drain regions.

22 Claims, 10 Drawing Sheets

SEMICONDUCTOR NONVOLATILE MEMORY, METHOD OF RECORDING DATA IN THE SEMICONDUCTOR NONVOLATILE MEMORY AND METHOD OF READING DATA FROM THE SEMICONDUCTOR NONVOLATILE MEMORY

BACKGROUND OF THE INVENTION

1. Field of the Invention

This invention relates to a semiconductor nonvolatile memory, to a method of recording data into the semiconductor nonvolatile memory (writing method and erasing method) and to a method of reading data from the semiconductor nonvolatile memory.

2. Description of the Related Art

Owing to its capability of holding stored data without requiring electric power, the semiconductor nonvolatile memory has been utilized as a memory in low-power-consumption equipment such as portable equipment.

In recent years, there has been proposed, as a semiconductor nonvolatile memory, a structure equipped with a memory cell of the MONOS (metal oxide nitride oxide) type having at least two gate electrodes (see, for example, U.S. Pat. No. 5,408,115 and U.S. Pat. No. 6,399,441).

The memory cells of the MONOS type are of the constitution including a transistor having a general gate-insulating film and a transistor having a gate-insulating film comprising an ONO laminated insulating film capable of accumulating an electric charge, which are formed on the channel-forming regions.

In the semiconductor nonvolatile memories disclosed in the above U.S. Pat. No. 5,408,115 and U.S. Pat. No. 6,399,441, however, the channel concentrations must be separately optimized in the channel-forming regions that are formed under the ONO laminated insulating film and under the gate-insulating film. This, however, involves complex operation when it is attempted to operate the memory and, besides, makes it difficult to easily and efficiently inject the electric charge into the ONO laminated insulating film.

Further, the memory cell structure becomes complex since it has at least two gate electrodes as well as a gate-insulating film that includes the ONO laminated insulating film, and the cost of production increases.

In order to decrease the area occupied by the memory cell, therefore, there has been proposed a structure in which the gate electrode on the ONO laminated insulating film is formed in the side wall type. When a voltage is applied, however, the electrode of the side wall type exhibits an increased resistance bringing about such a hindrance that the speed for reading out the data becomes low.

SUMMARY OF THE INVENTION

It is, therefore, a principal object of this invention to provide a semiconductor nonvolatile memory which enables the memory cell structure and the operation for controlling the memory to be further simplified, and which can be produced at an ever decreased cost.

In order to achieve the above object, a semiconductor nonvolatile memory according to a first aspect of the invention has a feature in the constitution as described below.

Namely, the semiconductor nonvolatile memory has a memory cell which includes resistance-varying portions and electric charge-accumulating portions in addition to the transistor structure.

The transistor includes a control electrode provided on a semiconductor substrate of a first type of electric conduction via an insulating layer, a first main electrode region and a second main electrode region, which are a pair of regions where there are diffused impurities of a second type of electric conduction different from the first type of electric conduction in the surface layer region of the semiconductor substrate at positions interposing the control electrode therebetween.

In the surface layer region of the semiconductor substrate of the first electric conduction type, the resistance-varying portion is formed in a portion held between at least either one of the first or the second main electrode region and the channel-forming region facing the control electrode, and is a region where the impurity concentration of the second type of electric conduction is lower than that of the one electrode. The electric charge-accumulating portion is a region which includes an insulating layer capable of accumulating an electric charge, and is formed on the resistance-varying portion.

According to the semiconductor nonvolatile memory of the first aspect of the invention, an electric field can be concentrated around the resistance-varying portion having an impurity concentration of the second type of electric conduction lower than that in the first and the second main electrodes to which a voltage is applied at the time of writing the data. Therefore, the generation of electric charge or hot carriers can be efficiently concentrated in the resistance-varying portion.

As a result, the electric charge can be selectively injected into the electric charge-accumulating portion from the resistance-varying portion. With the electric charge being accumulated and held in the electric charge-accumulating portion, the data (i.e., logic value "0" or "1") can be efficiently written.

The data, on the other hand, can be read out by utilizing a difference in the resistance of the resistance-varying portion that varies depending on the presence of electric charge accumulated in the electric charge-accumulating portion. That is, when the electric charge-accumulating portion is electrically charged due to the writing of data, the resistance of the resistance-varying portion increases, whereby the carriers are little supplied and the current does not flow sufficiently. When the electric charge-accumulating portion is not electrically charged, on the other hand, the resistance of the resistance-varying portion does not vary, whereby the carriers are supplied and the current flows to a sufficient degree. By utilizing this difference, the logic value "0" or "1" can be reliably discriminated.

As described above, the nonvolatile memory is realized with a structure based on a combination of the resistance-varying portion that contributes to efficiently writing and reading the data and the electric charge-accumulating portion capable of accumulating the electric charge, which is simpler than the structures of the prior art. Thus, there is realized a semiconductor nonvolatile memory that can be produced at a cost lower than the conventional counterparts.

DESCRIPTION OF THE PREFERRED EMBODIMENTS

Embodiments of the invention will now be described with reference to FIGS. 1 to 17. The drawings are simply to schematically illustrate the shapes and sizes of the constituent portions as well as their arrangement to such a degree that the invention can be comprehended and, hence, the invention is in no way limited to the diagramed examples only. For easy comprehension of the drawings, further, hatched areas representing the cross section are omitted except some portions. The following description simply deals with preferred examples, and the conditions of numerical values are not to limit the invention. In the drawings, further, the similar constituent components are denoted by the same reference numerals and their description is not repeated.

<First Embodiment>

Figure 1:
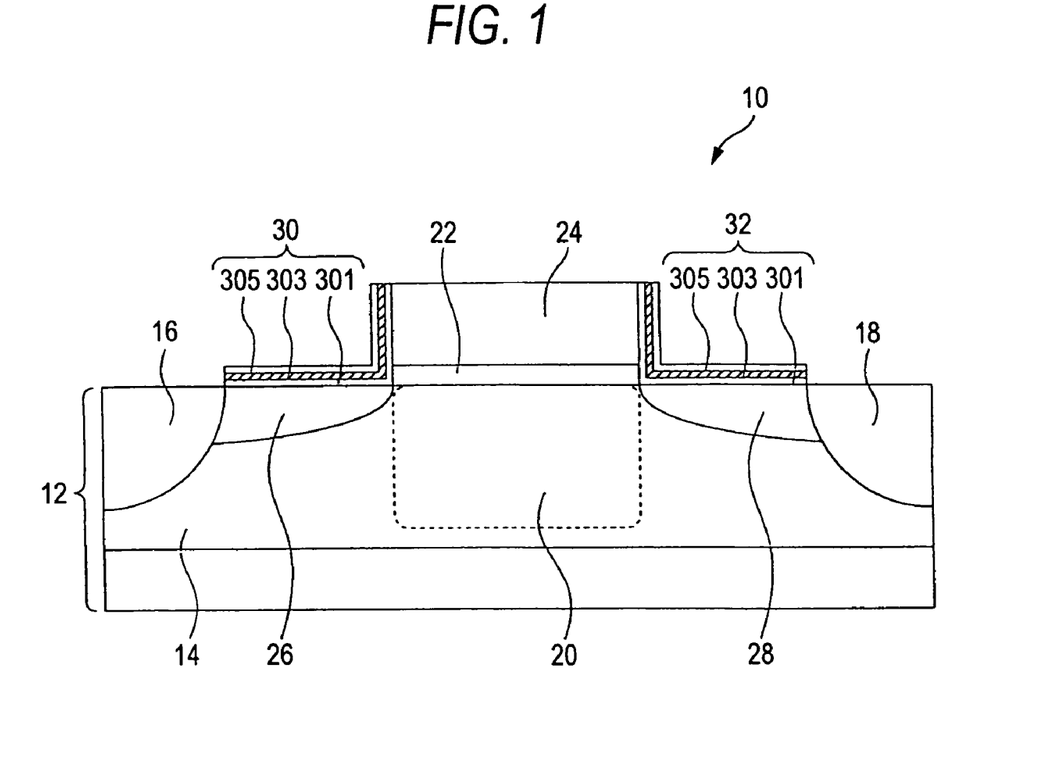
FIG. 1 is a sectional view schematically illustrating major portions of a memory cell that constitutes a semiconductor nonvolatile memory according to a first embodiment of the invention.

FIG. 1 is a sectional view schematically illustrating major portions of a memory cell 10 that constitutes a semiconductor nonvolatile memory according to this embodiment. In this embodiment, the first type of electric conduction is the p-type and the second type of electric conduction is the n-type. The following description deals with a case of an nMOSFET (n-type metal oxide semiconductor field-effect transistor).

Referring to FIG. 1, the memory cell 10 includes a p-well region 14 formed in the surface region of a silicon substrate 12 which is a p-type semiconductor substrate. In the surface region of the p-well region 14, there are provided a source electrode region (or called source region) 16 which is a first main electrode region containing n-type impurities at a high concentration ($n^+$-type) and a drain electrode region (or called drain region) 18 which is a second main electrode region being spaced apart by a predetermined distance. As is well known, the first and second main electrode regions are each provided with a metal electrode layer via a contact layer. The contact layer and the metal electrode layer constitute first and second main electrodes, i.e., constitute a source electrode and a drain electrode, respectively. In the following description, they are called source region and drain region, which, however, are equivalent to the source electrode and the drain electrode, respectively.

A gate electrode 24 which is a control electrode is formed in a region on the p-well region 14 sandwiched between the source region 16 and the drain region 18 via a gate-insulating film 22 which is a first insulating film. When the nMOSFET is operated, the surface region on the p-well region 14 sandwiched between the source region 16 and the drain region 18 works as a channel-forming region 20 where there is formed a channel (current path) between the source region and the drain region. Here, the gate oxide film is a silicon oxide film ($SiO_2$) and the gate electrode 24 is polysilicon (polycrystalline silicon). The structure of the above nMOSFET has heretofore been well known, and is not described here in detail.

In this embodiment, a first resistance-varying portion 26 is provided between the source region 16 and the channel-forming region 20 and in contact with the source region 16. Further, a second resistance-varying portion 28 is provided between the drain region 18 and the channel-forming region 20 and in contact with the drain region 18.

The first and second resistance-varying portions 26 and 28 are the regions ($n^-$ type) containing n-type impurities at a concentration lower than that in the source region 16 and in the drain region 18. This is for concentrating the electric field around the first and second resistance-varying portions 26 and 28 in order to selectively inject the electric charge into first and second electric charge-accumulating portions 30 and 32 that will be described later. As a result, hot carriers can be generated in a concentrated manner in the resistance-varying portions. The concentration in the resistance-varying portions and the broadness (width and depth) of the regions thereof can be arbitrarily set depending upon the object and design. The resistance-varying portions 26 and 28 have substantially the same structure as the so-called LDD (lightly doped drain).

In this embodiment, further, a first electric charge-accumulating portion 30 is provided on the first resistance-varying portion 26, and a second electric charge-accumulating portion 32 is provided on the second resistance-varying portion 28.

Here, the first and second electric charge-accumulating portions 30 and 32 are ONO (oxide nitride oxide) laminated insulating films. The ONO laminated insulating film is of a structure in which a silicon oxide film (first oxide film) 301, a silicon nitride film (SiN) 303 and a silicon oxide film (second oxide film) 305 are successively laminated on the first and second resistance-varying portions 26 and 28, and has a function for stably accumulating the electric charge.

The hot carriers injected from the first and second resistance-varying portions 26 and 28 are accumulated chiefly in the silicon nitride film 303 in the ONO laminated insulating film. The electric charge-accumulating portion can be arbitrarily selected depending upon the object and design of the memory that is constituted. For example, there can be arbitrarily selected a structure in which one or two or more insulating films selected from the group of insulating films consisting of silicon nitride film, aluminum oxide film ($Al_2O_3$) and hafnium oxide film ($HfO_x$) are sandwiched between the first oxide film and the second oxide film, which are, for example, silicon oxide films. In this constitution, further, the first and second electric charge-accumulating portions 30 and 32 are formed on the first and second resistance-varying portions 26 and 28 up to the side walls of the gate electrode 24 to reliably accumulate and hold the electric charge that is injected. The resistance-varying portion and the electric charge-accumulating portion may be provided between the channel-forming region 20 and either the source region 16 or the drain region 18. With the resistance-varying portions and the electric charge-accumulating portions being provided on the sides of both the source region electrode 16 and the drain region 18 as in this embodiment, however, it is allowed to write a data of 2 bits per a memory cell.

It is therefore made possible to decrease the area of the memory cell array in which a plurality of memory cells are arranged like an array, and to write the data of 2 bits per a memory cell relying upon a relatively simple structure as described above. It can therefore be expected to decrease the cost of production.

Figure 2:
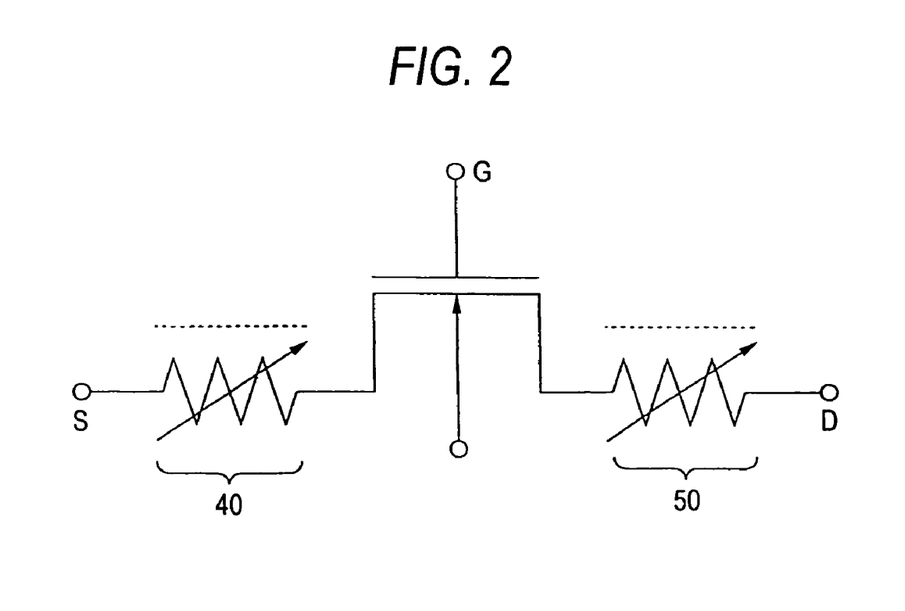
FIG. 2 is an equivalent circuit diagram of major portions of the memory cell according to the first embodiment of the invention.

FIG. 2 is a diagram of an equivalent circuit of the memory cell 10 having the above-mentioned constitution. In the circuit of FIG. 2, a first variable resistor 40 and a second variable resister 50 are connected to the sides of both the source region S and the drain region D that constitutes the nMOSFET included in the memory cell 10.

Operation of the memory cell 10 will be described next with reference to Table 1.

Described here is a case where the data (logic value "1" or "0") is recorded (written or erased) and read out on the side of the drain region 18 of the memory cell 10. When the same operation is to be carried out on the side of the source region 16, it will be obvious that the voltage is reversed between the source region and the drain region to carry out the same operation.

<Method of Recording (Writing) Data>

The operation for writing data (logic value "1" or "0") into the memory cell 10 is carried out by, for example, the method described below. Here, the initial state is the one (corresponds to a logic value "1") where no electric charge is accumulated in the electric charge-accumulating-portion, and a logic value "0" is written as data into the side of the drain region 18.

In order to write the data of logic value "0" into the side of the drain region 18, a positive voltage (+Vdw) is applied to the drain region 18, a positive voltage (+Vgw) is applied to the gate electrode 24, and the source region 16 is grounded.

Under these conditions, the electric field is concentrated around the second resistance-varying portion 28 having an n-type impurity concentration lower than that in the drain region 18. In the second resistance-varying portion 28, therefore, hot electrons (also called high-energy electrons) which are hot carriers are generated efficiently and in a concentrated manner due to impinging and ionization.

As a result, hot electrons are selectively injected into the second electric charge-accumulating portion 32 from the second resistance-varying portion 28 overcoming the energy barrier wall of the silicon oxide film 301, thereby to write the data. Here, the voltage +Vdw is large enough for generating hot electrons, and is not smaller than about 2 V and, preferably, about 5 to about 10 V, though it may vary depending upon the object and design. Further, the voltage +Vgw is large enough for forming carriers in the channel-forming region 20 and for injecting the hot electrons generated near the drain region 18 into the second electric charge-accumulating portion 32, and is, preferably, about 3 to about 12 V, though it may vary depending upon the object and design.

<Method of Reading Out Data>

The data on the side of the drain region 18 is read out by a method described below.

A positive voltage (+Vsr) is applied to the source region 16, a positive voltage (+Vgr) is applied to the gate electrode 24, and the drain region 18 is grounded.

On the side of the drain region 18 where the logic value "0" is written, the electric charge (electrons here) is accumulated in the second electric charge-accumulating portion 32, and the resistance of the second resistance-varying portion 28 increases. As a result, carriers are not easily supplied to the channel-forming region 20, and an electric current does not flow to a sufficient degree.

When the logic value "1" remains unchanged, which is the initial state, no electric charge is accumulated in the second electric charge-accumulating portion 32, and there is no change in the resistance of the second resistance-varying portion 28. As a result, carriers are supplied to the channel-forming region 20, and an electric current flows to a sufficient degree.

By utilizing a difference in the current flowing into the nMOSFET as described above, it is made possible to reliably discriminate which one of the logic value "1" or "0" is written.

<Method of Recording (Erasing) Data>

Then, the data on the side of the drain region 18 is erased by a method described below.

(a) When the memory cell 10 is used as, for example, an OTPROM (one time programmable read-only memory), the operation is finished up to one time of writing operation described above. It is, however, necessary to erase the data that was written at the time of testing and confirming the acceptable product.

In this case, the second electric charge-accumulating portion 32 on the side of the drain region 18 in where the logic value "0" has been written may be irradiated with ultraviolet rays or may be heat-treated (inclusive of leaving it in a high-temperature atmosphere) in order to neutralize the electric charge accumulated in the second electric charge-accumulating portion 32. According to this method, no circuit needs be separately mounted for effecting the electric erasure, and the memory can be constituted inexpensively.

(b) It is also possible to electrically erase the data like, for example, EEPROM (electrically erasable and programmable ROM).

When an electric charge is accumulated in the second electric charge-accumulating portion 32 (when a logic value "0" is written), a positive voltage (+Vde) is applied to the drain region 18, zero voltage or a negative voltage (−Vge) is applied to the gate electrode 24, and the source region 16 is opened (or is also called floating).

Under these conditions, hot holes generated around the drain region 18 are injected into the second electric charge-accumulating portion 32. As a result, the electric charge (electrons here) accumulated in the second electric charge-accumulating portion 32 is neutralized to erase the data. In this case, the voltage +Vde is large enough for generating hot holes near the drain region 18, and is not smaller than about 2 V and, preferably, about 4 to about 10 V. Further, the voltage −Vge is applied for efficiently concentrating the hot holes around the second electric charge-accumulating portion 32, and is about −7 to about 0 V.

TABLE 1

|  | Drain | Gate | Source |
| --- | --- | --- | --- |
| Write | +Vdw | +Vgw | 0 |
| Read | 0 | +Vgr | +Vsr |
| Erase | +Vde | 0 or −Vge | open |

Figure 3:
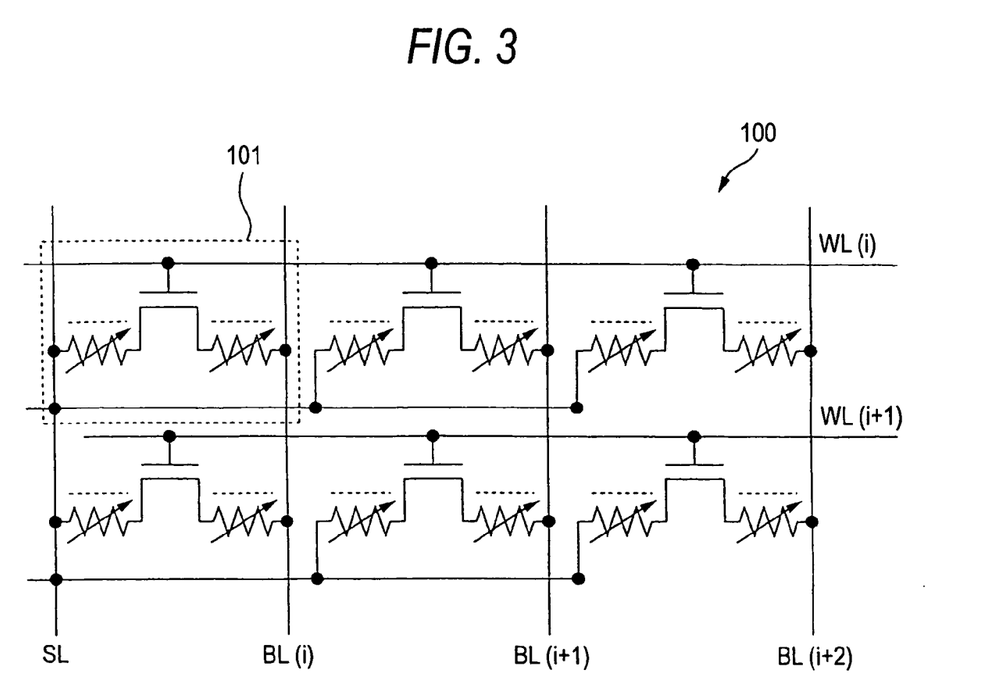
FIG. 3 is a schematic diagram of a memory cell array constituted by the memory cells of the first embodiment of the invention (first constitution)

Described below with reference to FIG. 3 is a first constitution of a memory cell array 100 in which a plurality of the above memory cells 10 are arranged like a matrix.

Referring to FIG. 3, the gate electrodes 24 of the memory cells 10 are connected to a word line WL(i) (i: natural number) provided in a first direction (direction of row). The source regions 16 and drain regions 18 of the memory cells 10 are connected to a source line SL and to a bit line BL(i) (i: natural number) provided in a second direction (direction of column) at right angles with the first direction. Here, the source regions 16 of all memory cells 10 are connected to a common source line SL. The memory cell 10 is connected to a point where the word line WL and the bit line BL intersect each other at right angles. Other constituent elements (e.g., drive circuit, etc.) for driving the memory cell array have been known, and are not described here in detail or are not illustrated.

Next, described below with reference to Table 2 is the operation of the memory cell array 100 (recording method (writing method/erasing method) and reading method). Described below is the case of a memory cell 101 at a point where the word line WL(i) and the bit line BL(i) are intersecting. The principles of operations were described already, and are not repeated here again.

Here, the operation for writing the data (logic value "1" or "0") into the memory cell 101 is conducted by a method described below. Here, the initial state is the one (corresponds to a logic value "1") where no electric charge is accumulated in the electric charge-accumulating portion, and a logic value "0" is written as data into the side of the drain region 18.

In order to write the data of logic value "0" into the side of the drain region 18, a writing drain voltage (+Vdw) is applied to the bit line BL(i), a writing gate voltage (+Vgw) is applied to the word line WL(i), and the source line SL is grounded.

Then, in order to read the data of logic value "0" written on the side of the drain region 18, a reading source voltage (+Vsr) is applied to the source line SL, a reading gate voltage (+Vgr) is applied to the word line WL(i), and the bit line BL(i) is grounded.

Then, to erase the data of logic value "0" written on the side of the drain region 18, an erasing drain voltage (+Vde) is applied to the bit line BL(i), an erasing gate voltage (0 or −Vge) is applied to the word line WL(i), and the source line SL is opened (or is also called floating).

TABLE 2

|  | BL (i) | WL (i) | SL |
| --- | --- | --- | --- |
| Write | +Vdw | +Vgw | 0 |
| Read | 0 | +Vgr | +Vsr |
| Erase | +Vde | 0 or −Vge | open |

When the same operation is to be carried out on the side of the source region 16, it will be obvious that the voltage is reversed between the source region and the drain region to carry out the same operation.

Figure 4:
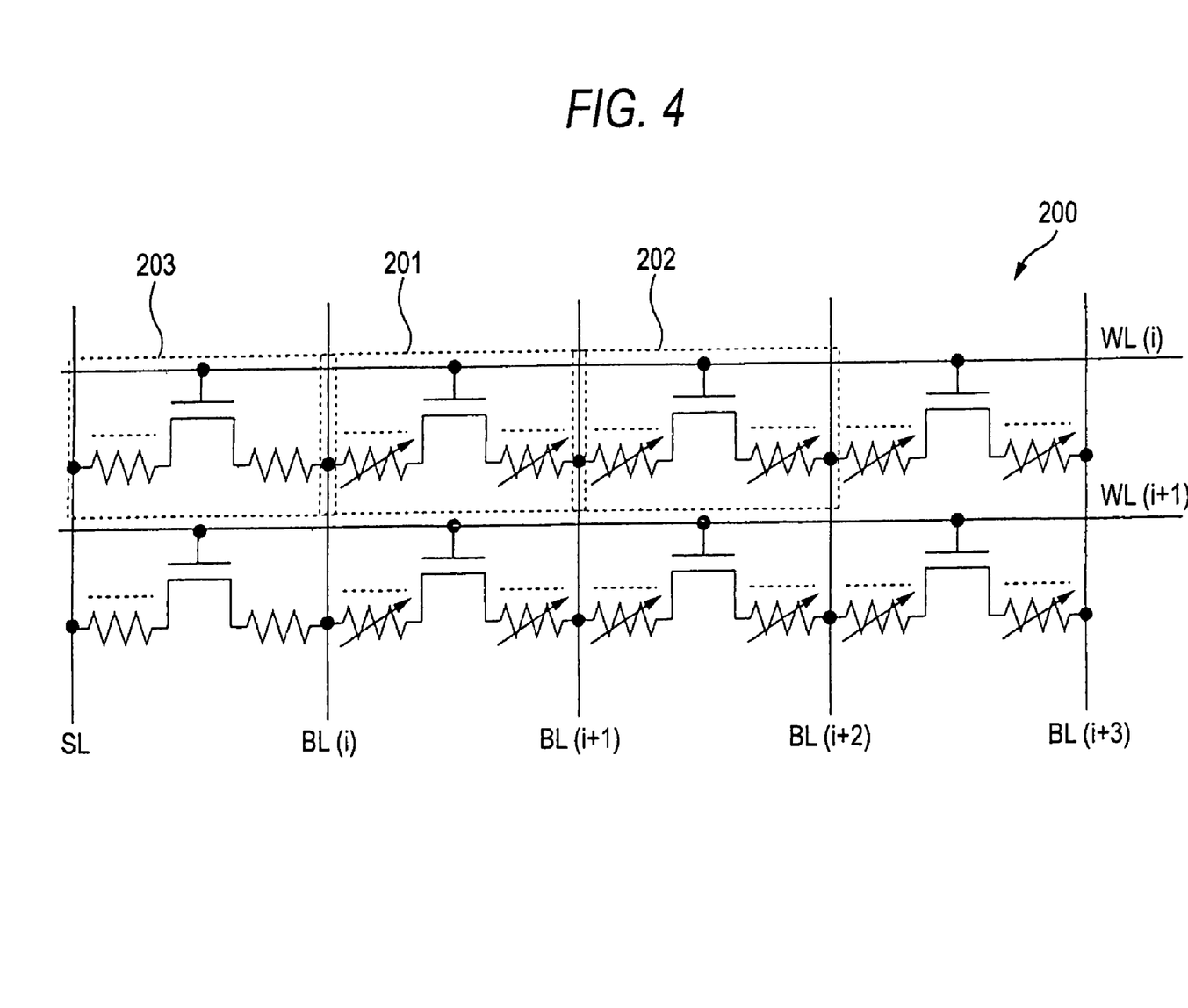
FIG. 4 is a schematic diagram of a memory cell array constituted by the memory cells of the first embodiment of the invention (second constitution)

Described below with reference to FIG. 4 is a second constitution of a memory cell array 200 in which a plurality of the above memory cells 10 are arranged like a matrix.

Referring to FIG. 4, the gate electrodes 24 of the memory cells 10 are connected to a word line WL(i) (i: natural number) provided in a first direction (direction of row). The source regions 16 and drain regions 18 of the memory cells 10 are connected to a bit line BL(i) (i: natural number) and to a bit line BL(i+1) (i: natural number) provided in a second direction (direction of column) at right angles with the first direction.

According to the second constitution, therefore, there is provided no separate source line SL to which the source regions 16 are connected but, instead, the bit line is utilized to which are connected the drain regions 18 of the memory cells that are neighboring in the direction of column. This makes it possible to simplify the structure of the control lines for driving the memory cells and, hence, to reduce the area of the memory cell array as compared to the first constitution.

Next, described below with reference to Table 3 is the operation of the memory cell array 200 (recording method (writing method/erasing method) and reading method). Described below is a memory cell 201 connected to the word line WL(i), bit line BL(i) and bit line BL(i+1).

Here, the operation for writing the data (logic value "1" or "0") into the memory cell 201 is conducted by a method described below. Here, the initial state is the one (corresponds to a logic value "1") where no electric charge is accumulated in the electric charge-accumulating portion, and a logic value "0" is written as data into the side of the drain region 18.

In order to write the data of logic value "0" into the side of the drain region 18, first, a writing drain voltage (+Vdw) is applied to the bit line BL(i+1), a writing gate voltage (+Vgw) is applied to the word line WL(i), and the bit line BL(i) is grounded.

Here, it is desired to apply a first write inhibit voltage (first record inhibit voltage) (+Vdwih1) to the bit line BL(i+2). Application of the first write inhibit voltage suppresses the data from being erroneously written into a memory cell neighboring the memory cell 201 in the direction of column, i.e., from being erroneously written into a memory cell 202 sharing the word line WL(i) and the bit line BL(i+1). Here, the first write inhibit voltage (+Vdwih1) is set to an intermediate voltage between the writing drain voltage (+Vdw) and ground voltage.

As required, further, a second write inhibit voltage (second record inhibit voltage) (+Vdwih2) may be applied even to a bit line BL(i+3) neighboring the bit line BL(i+2). This more effectively suppresses erroneous data from being written into an undesired memory cell. Here, the second write inhibit voltage (+Vdwih2) is set to an intermediate voltage between the first write inhibit voltage (+Vdwih1) and ground voltage.

Then, in order to read the data of logic value "0" written on the side of the drain region 18, a reading source voltage (+Vsr) is applied to the bit line BL(i), a reading gate voltage (+Vgr) is applied to the word line WL(i), and the bit line BL(i+1) is grounded.

Here, it is desired to apply a read inhibit voltage (+Vsrih) to the bit line BL(i−1). Application of the read inhibit voltage suppresses the data from being erroneously read out from a memory cell neighboring the memory cell 201 in the direction of column, i.e., from being erroneously readout from a memory cell 203 sharing the word line WL(i) and the bit line BL(i). Here, the read inhibit voltage (+Vsrih) is set to an intermediate voltage between the reading source voltage (+Vsr) and ground voltage. The bit line BL(i+2) assumes ground voltage or is floating.

Then, to erase the data of logic value "0" written on the side of the drain region 18, an erasing drain voltage (+Vde) is applied to the bit line BL(i+1), an erasing gate voltage (0 or −Vge) is applied to the word line WL(i), and a given voltage (denoted as "depend on" in Table 3) within an erasing range is applied to the bit lines BL(i), BL(i+1) and BL(i−1).

TABLE 3

| | BL (i − 1) | BL (i + 1) | WL (i) | BL (i) | BL (i + 2) |
|---|---|---|---|---|---|
| Write | dpd on | +Vdw | +Vgw | 0 | +Vdwih |
| Read | +Vsrih | 0 | +Vgr | +Vsr | dpd on |
| Erase | dpd on | +Vde | 0 or −Vge | dpd on | dpd on |

According to the semiconductor nonvolatile memory of this embodiment as will be obvious from the foregoing description, in writing the data, it is allowed to concentrate the electric field around the resistance-varying portion where the concentration of impurities of the second type of electric conduction is lower than that in the first and the second main, electrode regions to where the voltage is applied. It is therefore allowed to efficiently concentrate the generation of electric charge of hot carriers in the resistance-varying portion.

As a result, the electric charge can be selectively injected into the electric charge-accumulating portion from the resistance-varying portion. Upon accumulating and holding the electric charge in the electric charge-accumulating portion, the data (logic value "0" or "1") can be effectively written.

The data, on the other hand, can be read out by utilizing a difference in the resistance in the resistance-varying portion that varies depending upon the electric charge accumulated in the electric charge-accumulating portion. Namely, when the electric charge-accumulating portion is electrically charged due to the writing of data, the carrier is little supplied due to an increase in the resistance in the resistance-varying portion, and the electric current does not flow to a sufficient degree. When the electric charge-accumulating portion has not been electrically charged, on the other hand, the resistance does not vary in the resistance-varying portion, whereby the carrier is supplied and the electric current flows to a sufficient degree. By utilizing this reference, the logic value "0" or "1" can be reliably discriminated.

As described above, the non-volatile memory is realized by a simple structure of a combination of the resistance-varying portion that contributes to efficiently writing and reading the data, and an electric charge-accumulating portion capable of accumulating an electric charge. There is thus obtained a semiconductor nonvolatile memory that is produced at a cost lower than that of the conventional products.

Unlike the prior art, further, the electrode of the side wall-type has not been formed on the electric charge-accumulating portion. Therefore, there is no probability of a decreased reading speed caused by an increase in the resistance of the electrode when a voltage is applied.

<Second Embodiment>

A second embodiment of the invention will be described with reference to FIG. 5.

This embodiment is different from the first embodiment chiefly in regard to that the first and second resistance-varying portions 60 and 70, respectively, include first resistance-varying sub-portions 601, 701 and second resistance-varying sub-portions 603, 703 from the sides of the source region 16 and the drain region 18 toward the channel-forming region 20. The same constituent elements as those constituent elements described already in the first embodiment are denoted by the same reference numerals, but their concrete description is not repeated (the same holds for the subsequent embodiments).

Figure 5:
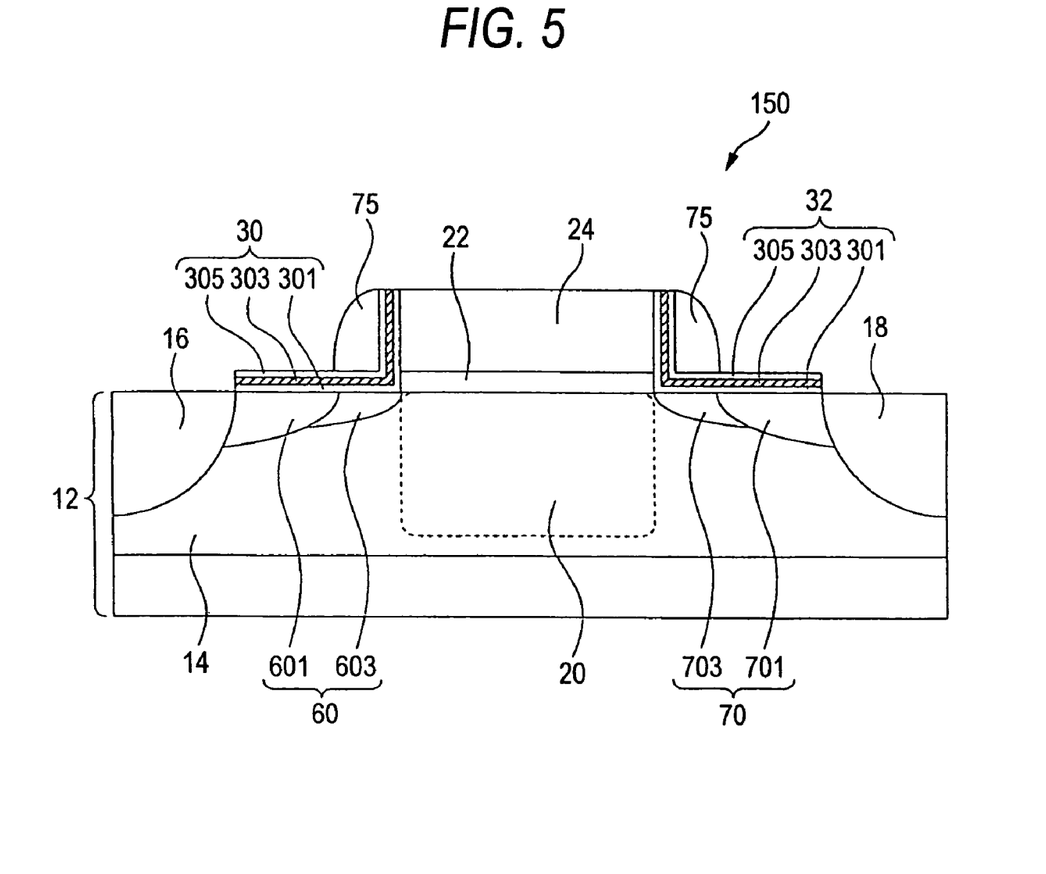
FIG. 5 is a sectional view schematically illustrating major portions of the memory cell that constitutes the semiconductor nonvolatile memory according to a second embodiment of the invention.

In the first and second resistance-varying portions 60 and 70 included in the memory cell 150 illustrated in FIG. 5, the first resistance-varying sub-portions 601 and 701 are the regions for promoting the injection of hot carriers generated at the time of writing the data into the electric charge-accumulating portions, and are working as hot electron injection promoting portions. On the other hand, the second resistance-varying sub-portions 603 and 703 are the regions where the concentration of n-type impurities is lower than that in the first resistance-varying sub-portions 601 and 701, and where the resistance varies more conspicuously than in the first and second resistance-varying portions 26 and 28 in the first embodiment. The concentration and broadness (width and depth) of the regions of the first and second resistance-varying sub-portions can be arbitrarily set depending upon the object and design. The second resistance-varying sub-portions 603 and 703 can be designed in a predetermined shape by using side wall spacers 75 that can be formed along, for example, the side walls of the gate electrode 24. The first and second resistance-varying portions 60 and 70 may be provided on either one side of the source region 16 or the drain region 18. Upon providing the first and second resistance-varying portions 60 and 70 on both sides of the source region 16 and the drain region 18 like in this embodiment, however, the reliability of the memory as a whole can be further improved, which is desirable.

According to this embodiment as will be obvious from the above description, it is allowed to obtain the same effect as that of the first embodiment.

According to this embodiment, further, there are provided, as the resistance-varying portion, the second resistance-varying sub-portions 603 and 703 where the resistance varies conspicuously in addition to the first resistance-variable sub-portions 601 and 701 which are the hot electron injection promoting portions. As compared to the first embodiment, therefore, it is allowed to finely adjust the amount of change of the resistance in the resistance-varying portions.

As a result, the data can be recorded (written or erased) into the memory or the data can be read out from the memory highly precisely as compared to the first embodiment.

<Third Embodiment>

A third embodiment of the invention will be described with reference to FIG. 6.

This embodiment is different from the first embodiment chiefly in regard to that a first sub-electrode 80 and a second sub-electrode 85 are formed on the first and second electric charge-accumulating portions 30 and 32.

Figure 6:
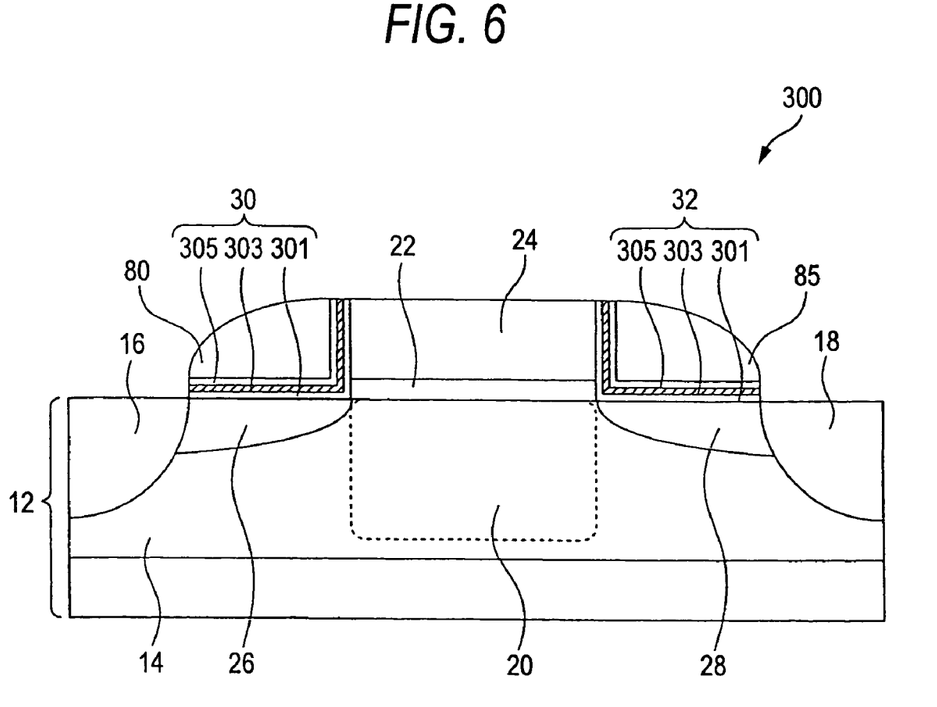
FIG. 6 is a sectional view schematically illustrating major portions of the memory cell that constitutes the semiconductor nonvolatile memory according to a third embodiment of the invention.

According to the memory cell 300 of this embodiment as shown in FIG. 6, the first and second sub-electrodes 80 and 85 of polysilicon are separately formed like islands on the first and second electric charge-accumulating portions 30 and 32. The first and second sub-electrodes 80 and 85 are not limited to the side-wall type shape but may be formed on the first and second electric charge-accumulating portions 30 and 32.

Figure 7:
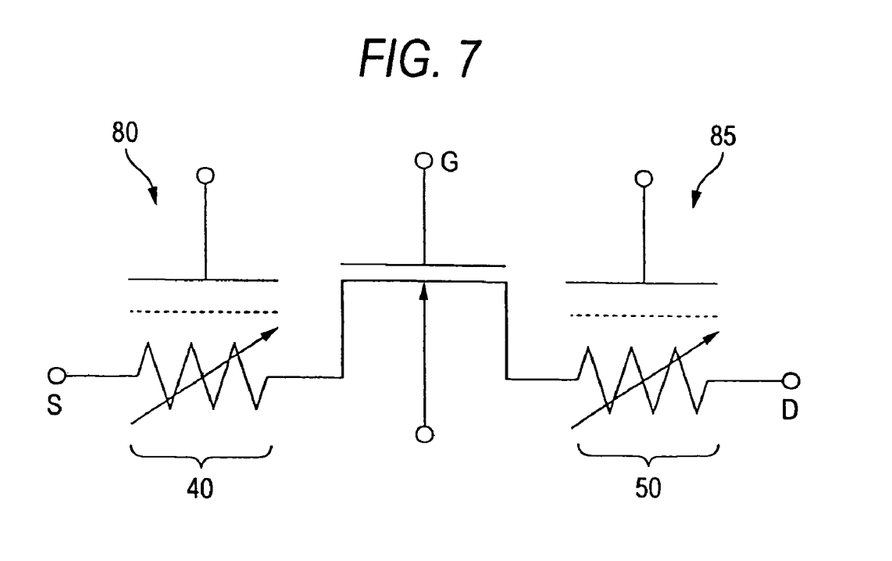
FIG. 7 is an equivalent circuit diagram of major portions of the memory cell according to the third embodiment of the invention.

FIG. 7 is a diagram of an equivalent circuit of the memory cell 300 constituted as described above. As shown in FIG. 7, the first and second sub-electrodes 80 and 85 are arranged facing, and close to, the first and second variable resistors 40 and 50 connected to both sides of the source region S and the drain region D that constitute an nMOSFET which is the memory cell 300.

The operation of the memory cell 300 will be described below with reference to Table 4. Described below is a case where the data (logic value "1" or "0" is recorded (written or erased) and read out on the side of the drain region 18 in the memory cell 300. When the same operation is to be conducted on the side of the source region 16, it will be obvious that the same operation is carried out while reversing the voltage across the source region and the drain region.

<Method of Recording (Writing) Data>

The operation for writing data (logic value "1" or "0") into the memory cell 300 is carried out according to, for example, the procedure described below. Here, the initial state is the one (corresponds to a logic value "1") where no electric charge is accumulated in the electric charge-accumulating portion, and a logic value "0" is written as data into the side of the drain region 18.

In order to write the data of logic value "0" into the side of the drain region 18, a positive voltage (+Vdw) is applied to the drain region 18, a positive voltage (+Vgw) is applied to the gate electrode, and the source region 16 is grounded like in the first embodiment.

In the case of this constitution, further, a positive voltage (+Vegw) may be applied to the second sub-electrode 85 to promote the injection of hot electrons into the electric charge-accumulating portion.

<Method of Reading Data>

Then, the data of logic value "0" written into the side of the drain region 18 is read out by applying a positive voltage (+Vsr) to the source region 16, applying a positive voltage (+Vgr) to the gate electrode, and grounding the drain region 18. In this case, the second sub-electrode 85 is grounded, and there is no probability that the reading speed is affected.

<Method of Recording (Erasing) Data>

Then, the data of logic value "0" written into the side of the drain region 18 is erased by applying a positive voltage (+Vde) to the drain region 18, applying zero voltage or a negative voltage (−Vge) to the gate electrode, and opening the source region 16.

In the case of this constitution, further, a negative voltage (−Vege) is applied to the second sub-electrode 85 to inject hot holes into the second electric charge-accumulating portion 32 and to promote the release of electrons from the second electric charge-accumulating portion 32.

TABLE 4

|  | Drain | Gate | Source | Erase Gate |
| --- | --- | --- | --- | --- |
| Write | +Vdw | +Vgw | 0 | +Vegw |
| Read | 0 | +Vgr | +Vsr | 0 |
| Erase | +Vde | 0 or −Vge | open | −Vege |

When the sub-electrodes formed in the shape of side walls on the NON laminated insulating film are used for reading the data as described above already, there arouses a problem of delay in the reading speed. However, the sub-electrodes may be used only for efficiently conducting the data recording (writing/erasing) operation as in this constitution. The sub-electrode may be provided on at least either the first electric charge-accumulating portion 30 or the second electric charge-accumulating portion 32. Upon providing the sub-electrodes on both the first and the second electric charge-accumulating portions 30 and 32 as in this embodiment, however, the data recording (writing/erasing) operation can be conducted more efficiently.

Figure 8:
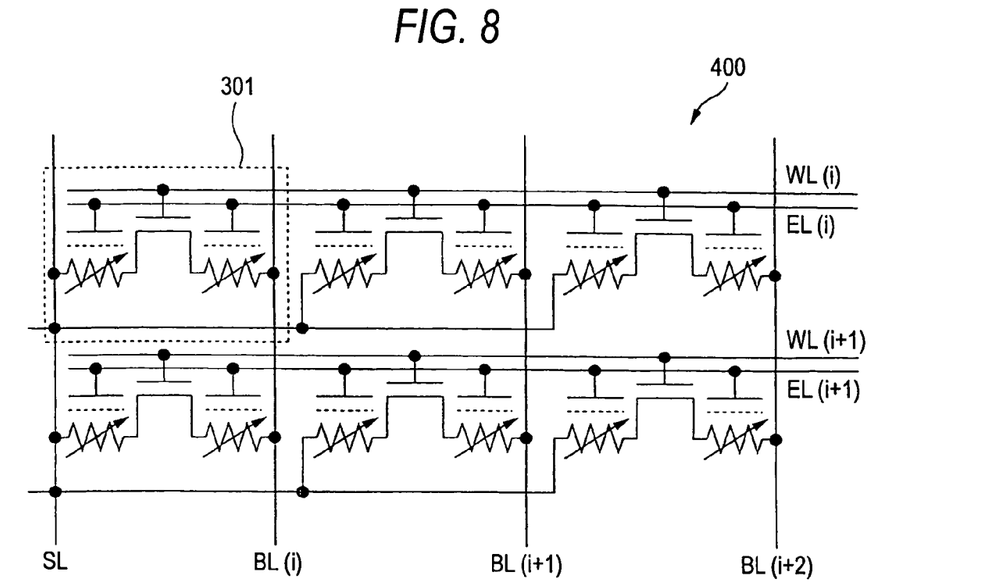
FIG. 8 is a schematic diagram of the memory cell array constituted by the memory cells of the third embodiment of the invention (first constitution)

Next, described below with reference to FIG. 8 is a first constitution of a memory cell array 400 in which a plurality of the above memory cells 300 are arranged like a matrix.

As shown in FIG. 8, gate electrodes 24 of the memory cells 300 are connected to a word line WL(i) (i: natural number) provided in a first direction (direction of row) The source regions 16 and drain regions 18 of the memory cells 300 are connected to a source line SL and to a bit line BL(i) (i: natural number) provided in a second direction (direction of column) at right angles with the first direction. Here, the source regions 16 of all memory cells 300 are connected to the common source line SL.

In this constitution, further, the pair of first and second sub-electrodes 80 and 85 possessed by the memory cells 300 are connected to a common erasing line EL(i)(i: natural number) provided in the first direction. Here, the two sub-electrodes 80 and 85 possessed by one cell are connected to the common erasing line EL. However, the two sub-electrodes 80 and 85 may be connected to different erasing lines EL.

The operation of the memory cell array 400 (recording method (writing method/erasing method) and reading method) will be described below with reference to Table 5. Described below is an example of a memory cell 301 at a point where a word line WL(i) and a bit line BL(i) intersect each other.

The operation for writing data (logic value "1" or "0") into the memory cell 301 is carried out according to, for example, a method described below. Here, the initial state is the one (corresponds to a logic value "1") where no electric charge is accumulated in the electric charge-accumulating portion, and a logic value "0" is written as data into the side of the drain region 18.

In order to write the data of logic value "0" into the side of the drain region 18, first, a writing drain voltage (+Vdw) is applied to the bit region BL(i), a writing gate voltage (+Vgw) is applied to the word line WL(i), and the source line SL is grounded.

In this case, further, a writing voltage (+Vegw) is applied to the erasing line EL(i) to efficiently write the data.

Then, the data of logic value "0" written into the side of the drain region 18 is read out by applying a reading source voltage (+Vsr) to the source line SL, applying a reading gate voltage (+Vgr) to the word line WL(i), and grounding the bit line BL(i).

Then, the data of logic value "0" written into the side of the drain region 18 is erased by applying an erasing voltage (+Vde) to the bit line BL(i), applying an erasing gate voltage (0 or −Vge) to the word line WL(i), and Opening the source line SL.

Here, an erasing voltage (−Vege) is applied to the erasing line EL(i) to efficiently erase the data.

TABLE 5

|  | BL (i) | WL (i) | SL | EL |
|---|---|---|---|---|
| Write | +Vdw | +Vgw | 0 | +Vegw |
| Read | 0 | +Vgr | +Vsr | 0 |
| Erase | +Vde | 0 or −Vge | open | −Vege |

When the same operation is to be conducted on the side of the source region 16, it will be obvious that the same operation is carried out while reversing the voltage between the source region and the drain region.

Figure 9:
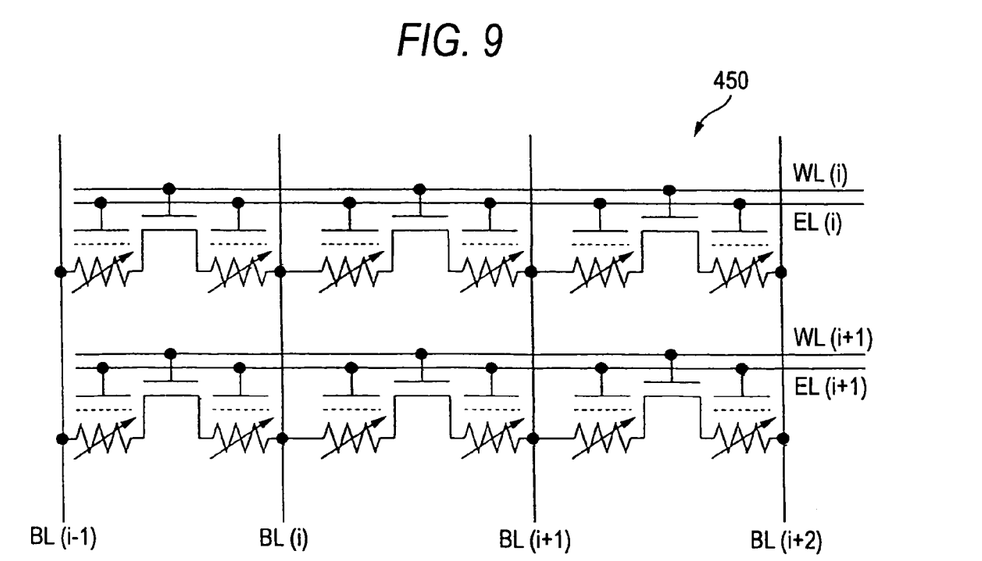
FIG. 9 is a schematic diagram of the memory cell array constituted by the memory cells of the third embodiment of the invention (second constitution)

As shown in FIG. 9 and described already, further, the source line SL may not be used (second constitution). The operation of the memory cell array 450 in this case is such that a predetermined voltage is applied to the erasing line EL as described above in addition to applying the voltage to the memory cell array 200 of the second constitution described in the first embodiment. Therefore, the operation of the memory cell array 450 is not repeated here again.

According to this embodiment as will be obvious from the foregoing description, there is obtained the effect same as that of the first embodiment.

According to this embodiment, further, both the source region 16 and the drain region 18 constituting the memory cell are provided with resistance-varying portions and electric charge-accumulating portions, and with sub-electrodes that contribute to efficiently writing and erasing the data.

This makes it possible to decrease the area of the memory cell array in which a plurality of memory cells are arranged like an array and to efficiently write and erase the data of 2 bits per a memory cell. Therefore, a decrease in the cost of product can be expected.

<Fourth Embodiment>

A fourth embodiment of the invention will be described with reference to FIG. 10.

This embodiment is different from the third embodiment chiefly in regard to that a sub-electrode 86 is a continuous member formed on the first electric charge-accumulating portion 30 through up to the second electric charge-accumulating portion 32.

Figure 10:
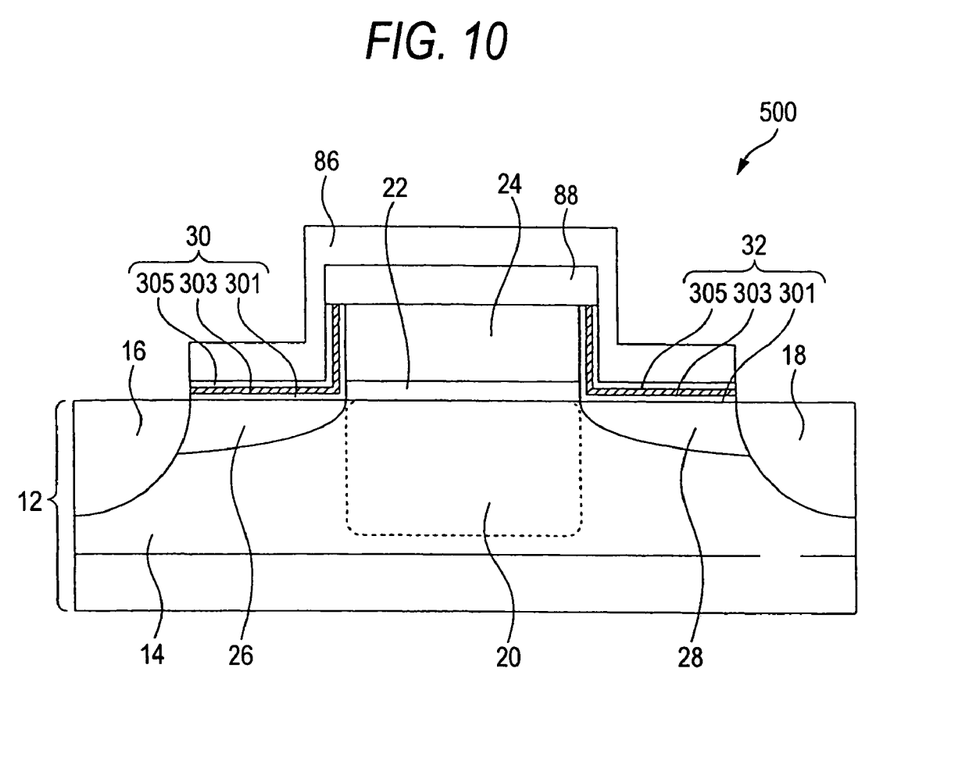
FIG. 10 is a sectional view schematically illustrating major portions of the memory cell that constitutes the semiconductor nonvolatile memory according to a fourth embodiment of the invention.

According to a memory cell 500 of this embodiment as shown in FIG. 10, the sub-electrode 86 is formed from the first electric charge-accumulating portion 30 through up to the second electric charge-accumulating portion 32 covering the gate electrode 24 via a silicon oxide film 88 which is a second insulating film. The gate electrode 24 and the sub-electrode 86 are electrically separated or insulated from each other by the first and second electric charge-accumulating portions 30, 32 and by the silicon oxide film 88.

Figure 11:
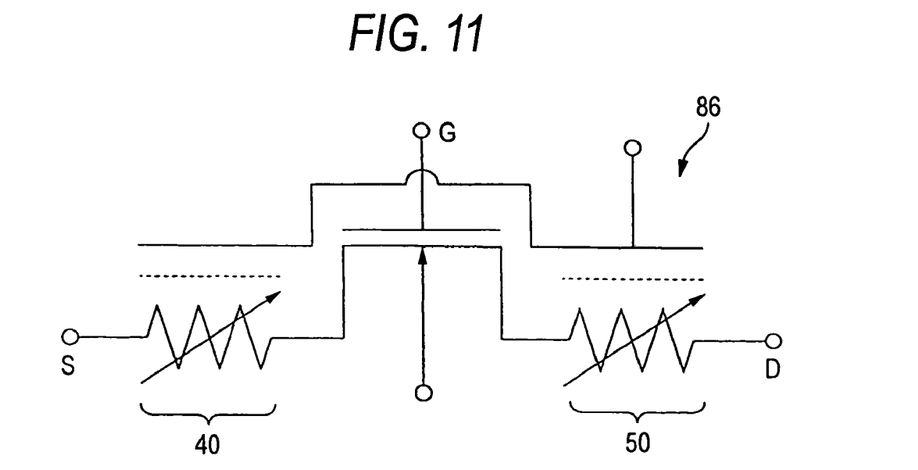
FIG. 11 is an equivalent circuit diagram of major portions of the memory cell according to the fourth embodiment of the invention.

FIG. 11 is a diagram of an equivalent circuit of the memory cell 500 constituted as described above. As shown in FIG. 11, the sub-electrode 86 is arranged facing, and close to, the first and second variable resistors 40 and 50 connected to both sides of the source region S and the drain region D that constitute an nMOSFET which is the memory cell 500.

Figure 12:
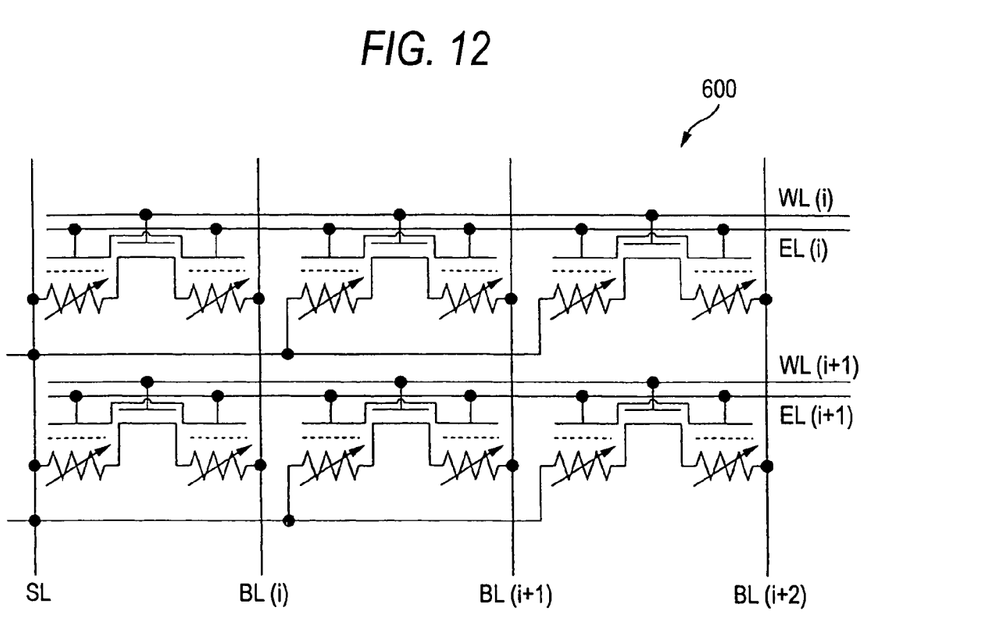
FIG. 12 is a schematic diagram of the memory cell array constituted by the memory cells of the fourth embodiment of the invention (first constitution)
Figure 13:
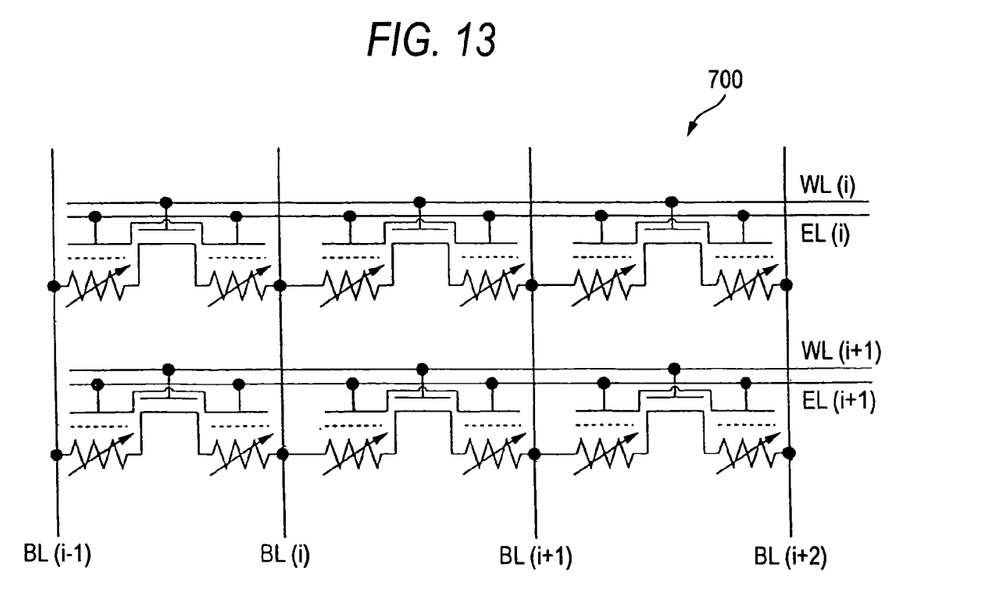
FIG. 13 is a schematic diagram of the memory cell array constituted by the memory cells of the fourth embodiment of the invention (second constitution)

FIGS. 12 and 13 are diagrams illustrating the constitution of a memory cell array in which a plurality of the memory cells 500 are arranged like a matrix.

FIG. 12 illustrates a memory cell array 600 of a first constitution corresponding to the first constitution (having source line SL) of the third embodiment, and FIG. 13 illustrates a memory cell array 700 of a second constitution corresponding to the second constitution (without source line SL) of the third embodiment. The memory cell arrays 600 and 700 are operated under the same conditions as those of applying voltages as described in the third embodiment, and their description is not repeated here again.

According to this embodiment as will be obvious from the foregoing description, there is obtained the same effect as that of the third embodiment.

According to this embodiment, further, the sub-electrode 86 is continuously formed from the first electric charge-accumulating portion 30 through up to the second electric charge-accumulating portion 32. Therefore, the sub-electrode has a resistance smaller than that of the island-like sub-electrodes of the third embodiment.

According to this embodiment, therefore, the data writing speed and the erasing speed are not limited by the resistance of the sub-electrode.

<Fifth Embodiment>

A fifth embodiment of the invention will be described with reference to FIG. 14.

This embodiment is different from the fourth embodiment chiefly in regard to that a sub-electrode 90 is covering the gate electrode 24 without via the second insulating film 88 (see FIG. 10).

Figure 14:
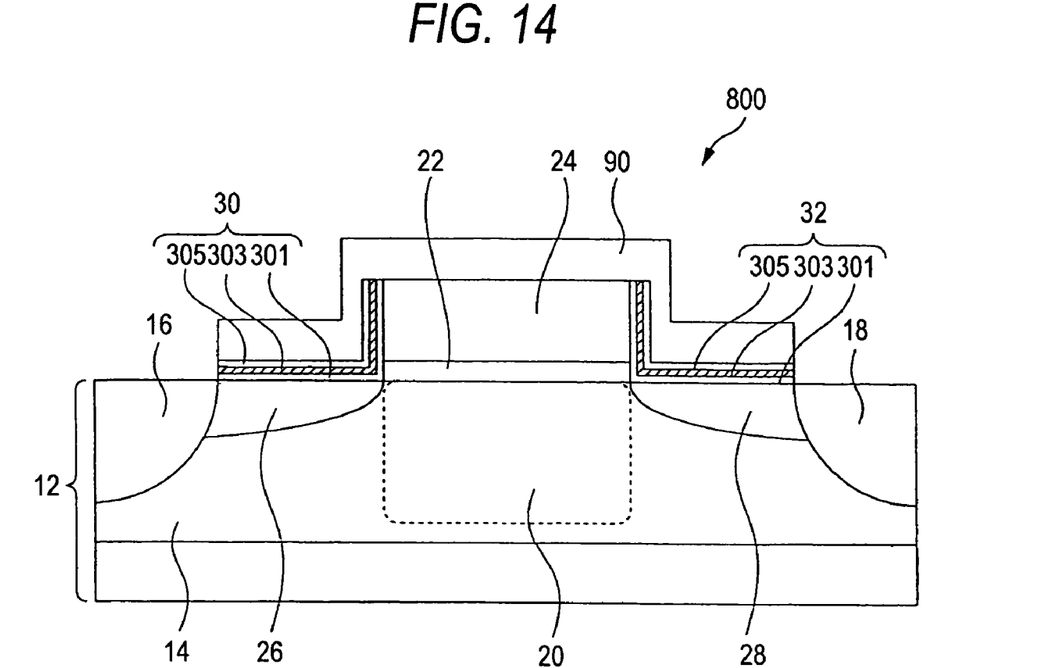
FIG. 14 is a sectional view schematically illustrating major portions of the memory cell that constitutes the semiconductor nonvolatile memory according to a fifth embodiment of the invention.

According to a memory cell 800 of this embodiment as shown in FIG. 14, the sub-electrode 90 is formed from the first electric charge-accumulating portion 30 through up to the second electric charge-accumulating portion 32 like in the fourth embodiment. In this embodiment, however, the second insulating film 88 is not formed on the gate electrode 24, and the gate electrode 24 is electrically connected to the sub-electrode 90.

Figure 15:
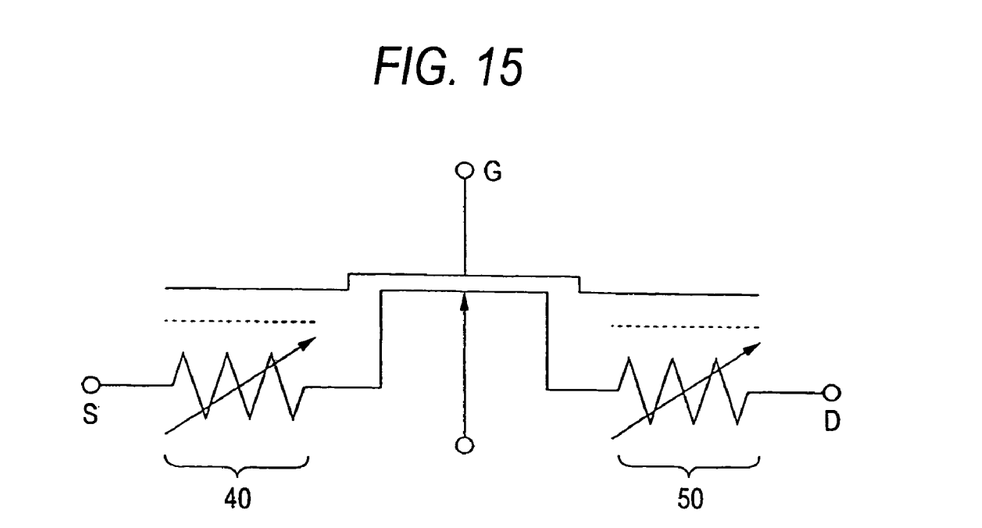
FIG. 15 is an equivalent circuit diagram of major portions of the memory cell according to the fifth embodiment of the invention.

FIG. 15 is a diagram of an equivalent circuit of the memory cell 800 constituted as described above. As shown in FIG. 15, the sub-electrode 90 is connected to the gate electrode (G) 24, the sub-electrode 90 being arranged facing the first and second variable resistors 40 and 50 connected to both sides of the source region S and the drain region D that constitute an nMOSFET which is the memory cell 800.

The operation of the memory cell 800 will be described below with reference to Table 6. Described below is a case where the data (logic value "1" or "0") is recorded (written or erased) and read out on the side of the drain region 18 in the nMOSFET 10. When the same operation is to be conducted on the side of the source region 16, it will be obvious that the same operation is carried out while reversing the voltage between the source region and the drain region.

<Method of Recording (Writing) Data>

The operation for writing data (logic value "1" or "0") into the memory cell 800 is carried out according to, for example, a procedure described below. Here, the initial state is the one (corresponds to a logic value "1") where no electric charge is accumulated in the electric charge-accumulating portion, and a logic value "0" is written as data into the side of the drain region 18.

In order to write the data of logic value "0" into the side of the drain region 18, a positive voltage (+Vdw) is applied to the drain region 18, a positive voltage (+Vgw) is applied to the gate electrode 24, and the source region 16 is grounded.

In the case of this constitution, a positive voltage (+Vgw [V]) is applied to the sub-electrode 90, too, at the time of applying the positive voltage (+Vgw) to the gate electrode 24 to promote the injection of hot electrons into the electric charge-accumulating portions.

<Method of Reading Data>

Then, the data of logic value "0" written into the side of the drain region 18 is read out by applying a positive voltage (+Vsr) to the source region 16, applying a positive voltage (+Vgr) to the gate electrode, and grounding the drain region 18.

<Method of Recording (Erasing) Data>

Then, the data of logic value "0" written into the side of the drain region 18 is erased by applying a positive voltage (+Vde) to the drain region 18, applying zero voltage or a negative voltage (−Vge) to the gate electrode, and opening the source region 16.

In the case of this constitution, further, zero voltage or a negative voltage (−Vge) is applied to the sub-electrode 90, too, at the time of applying the zero voltage or the negative voltage (−Vge) to the gate electrode 24 to promote the injection of hot holes into the second electric charge-accumulating portion 32 and to promote the release of electrons from the second electric charge-accumulating portion 32.

TABLE 6

|  | Drain | Gate | Source |
| --- | --- | --- | --- |
| Write | +Vdw | +Vgw | 0 |
| Read | 0 | +Vgr | +Vsr |
| Erase | +Vde | 0 or −Vge | open |

Figure 16:
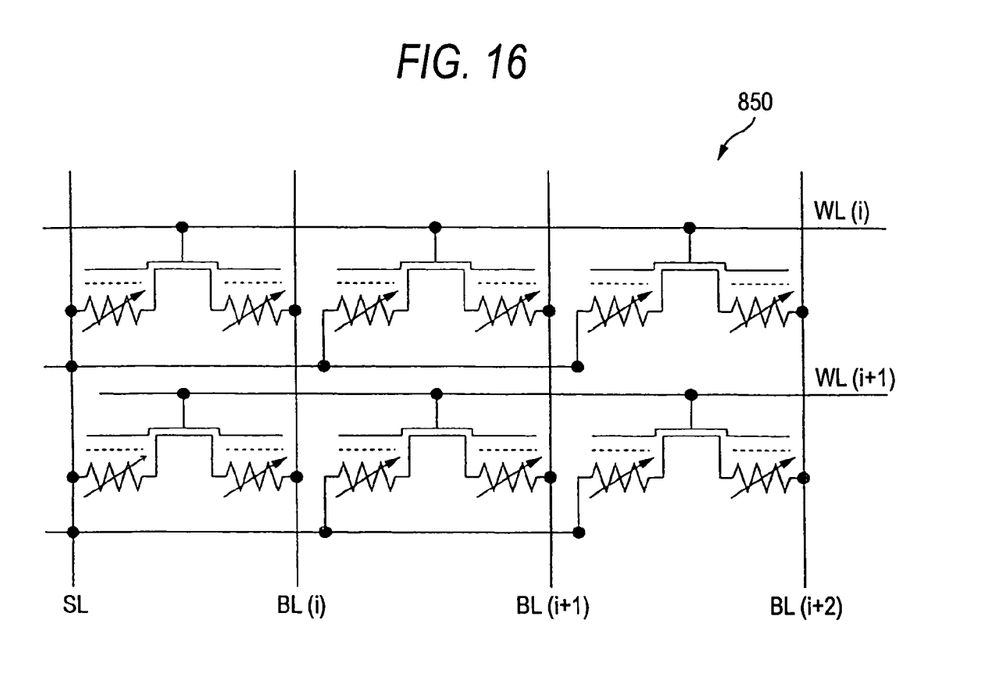
FIG. 16 is a schematic diagram of the memory cell array constituted by the memory cells of the fifth embodiment of the invention (first constitution)
Figure 17:
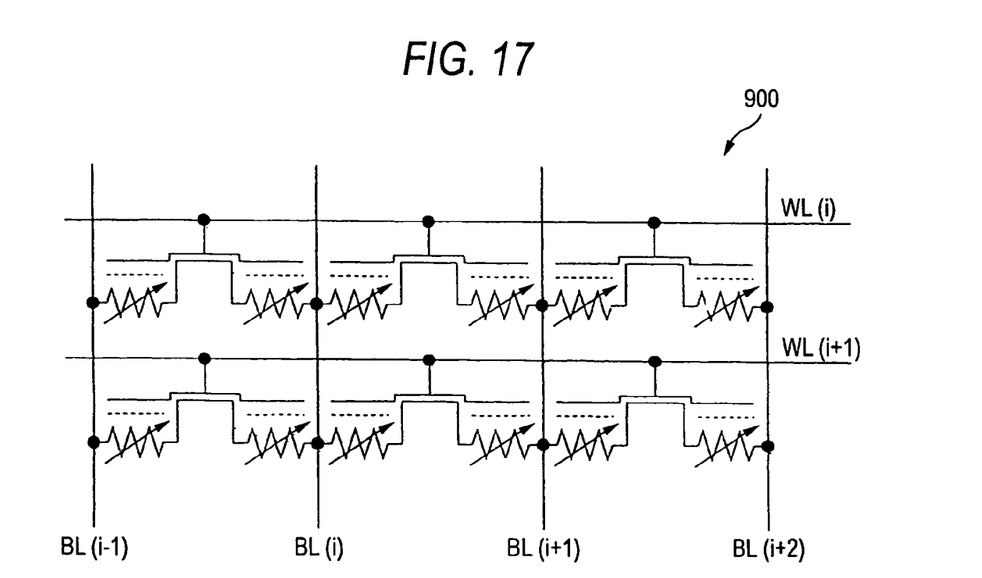
FIG. 17 is a schematic diagram of the memory cell array constituted by the memory cells of the fifth embodiment of the invention (second constitution).

FIGS. 16 and 17 are diagrams illustrating the constitution of a memory cell array in which a plurality of the memory cells 800 are arranged like a matrix.

FIG. 16 illustrates a memory cell array 850 of a first constitution corresponding to the first constitution (having source line SL) of the fourth embodiment, and FIG. 17 illustrates a memory cell array 900 of a second constitution corresponding to the second constitution (without source line SL) of the fourth embodiment. The memory cell arrays 850 and 900 are operated under the same conditions as those of applying voltages as described in the fourth embodiment with the exception of applying a predetermined voltage which is applied to the sub-electrode 90 to the gate electrode 24, too, and their description is not repeated here again.

Namely, in this embodiment, the gate electrode 24 and the sub-electrode 90 are electrically connected together. Like in the fourth embodiment, therefore, no erasing line EL (see FIGS. 12 and 13) is necessary for separately driving the sub-electrode 90. It is therefore possible to simplify the structure of the control line for driving the memory cells, and a decrease in the area of the memory cell array can be expected as compared to that of the fourth embodiment.

According to this embodiment as will be obvious from the foregoing description, there is obtained the same effect as that of the fourth embodiment.

According to this embodiment, further, the sub-electrode 90 is formed from the first electric charge-accumulating portion 30 through up to the second electric charge-accumulating portion 32, and is electrically connected to the gate electrode 24. Therefore, the resistance of the gate electrode 24 is lowered at the time of reading the data, and the data can be read out at a high speed.

The invention is not limited to the above-mentioned embodiments only. Namely, any preferred conditions can be combined together at any desired stage, and to which the invention can be applied.

The above embodiments have dealt with a memory cell of the case of an nMOSFET with the first type of electric conduction being the p-type and the second type of electric conduction being the n-type. Contrary to the above case, however, the invention can also be applied even to the case of a pMOSFET with the first type of electric conduction being the n-type and the second type of electric conduction being the p-type. Concretely speaking, the voltage applied to the case of the nMOSFET may be applied in a reversed manner.

What is claimed is:

1. A semiconductor nonvolatile memory including memory cells, comprising:

a transistor including a control electrode provided on a semiconductor substrate of a first conductivity type with a first insulating film therebetween, and a pair of a first main electrode region and a second main electrode region which include diffused impurities of a second conductivity type opposite the first conductivity type and which are in a surface layer region of the semiconductor substrate at positions with the control electrode interposed therebetween;

a resistance-varying portion of the second conductivity type in the surface layer region of the semiconductor substrate at a portion sandwiched between at least either one of the first main electrode region or the second main electrode region and a channel-forming region under the control electrode, the resistance-varying portion trapping electrons therein and having an impurity concentration lower than an impurity concentration of the at least either one of the first main electrode region or the second main electrode region; and an electric charge-accumulating portion formed on the resistance-varying portion, the electric charge-accumulating portion including an insulating layer that accumulates an electric charge from the trapped electrons in the resistance varying portion, the trapped electrons injected into the electric charge-accumulating portion by hot carriers.

2. A semiconductor nonvolatile memory according to claim 1, wherein the electric charge-accumulating portion is further formed on a side wall of the control electrode.

3. A semiconductor nonvolatile memory according to claim 1, wherein a sub-electrode is formed on the electric charge-accumulating portion.

4. A semiconductor nonvolatile memory according to claim 1, wherein:

the resistance-varying portion includes a first resistance-varying portion provided in a portion sandwiched between the first main electrode region and the channel-forming region, and a second resistance-varying portion provided in a portion sandwiched between the second main electrode region and the channel-forming region; and the electric charge-accumulating portion includes a first electric charge-accumulating portion formed on the first resistance-varying portion and a second electric charge-accumulating portion formed on the second resistance-varying portion.

5. A semiconductor nonvolatile memory according to claim 4, wherein a first sub-electrode is formed on the first electric charge-accumulating portion and a second sub-electrode is formed on the second electric charge-accumulating portion.

6. A semiconductor nonvolatile memory according to claim 4, further comprising a continuous sub-electrode formed on the first electric charge-accumulating portion, over the control electrode and on the second electric charge-accumulating portion.

7. A semiconductor nonvolatile memory according to claim 6, wherein a second insulating film is formed between the control electrode and the sub-electrode over the control electrode.

8. A semiconductor nonvolatile memory according to claim 1, wherein the resistance-varying portion includes a first resistance-varying sub-portion from a side of one of the first and second main electrode regions toward the channel-forming region, and a second resistance-varying sub-portion having an impurity concentration lower than an impurity concentration of the first resistance-varying sub-portion.

9. A semiconductor nonvolatile memory according to claim 1, wherein the electric charge-accumulating portion comprises one or two or more kinds of insulating films selected from the group of insulating films consisting of a first oxide film, a silicon nitride film, an aluminum oxide film and a hafnium oxide film, as well as a second oxide film in order from a side of the resistance-varying portion.

10. A semiconductor nonvolatile memory according to claim 9, wherein either one or both of the first and second oxide films are a silicon oxide film.

11. A semiconductor nonvolatile memory according to claim 3, wherein the sub-electrode includes polycrystalline silicon.

12. A semiconductor nonvolatile memory according to claim 1, comprising a pair of memory cells, wherein control electrodes of the pair of memory cells are connected to a common word line, first main electrode regions of the pair of memory cells are connected to a common source line, and a second main electrode region of one of the pair of memory cells and the second main electrode region of another of the pair of memory cells are connected to different bit lines.

13. A semiconductor nonvolatile memory according to claim 1, comprising a pair of memory cells, wherein control electrodes of the pair of memory cells are connected to a common word line, a first main electrode region of one of the pair of memory cell is connected to a first bit line, a second main electrode region of the one of the pair of memory cells and a first main electrode region of another of the pair of memory cells are connected to a second bit line different than the first bit line, and a second main electrode region of the another of the pair of memory cells is connected to a third bit line different than the first and second bit lines.

14. A non-volatile memory comprising:
first and second diffusion regions of a first conductivity type in a substrate of a second conductivity type opposite the first conductivity type;
a control electrode on the substrate between the first and second diffusion regions;
a first insulating film between the control electrode and the substrate;
a first resistance varying region of the first conductivity type in the substrate between the first diffusion region and the control electrode that has electrons therein,
the first resistance varying region having an impurity concentration that is lower than an impurity concentration of the first diffusion region; and
a first electric charge accumulating layer, on the first resistance varying region and an outer peripheral sidewall of the control electrode, that accumulates electric charge from the trapped electrons in the first resistance varying portion, the trapped electrons injected into the first electric charge accumulating layer by hot carriers.

15. The non-volatile memory of claim 14, further comprising:
a second resistance varying region of the first conductivity type in the substrate between the second diffusion region and the control electrode that traps electrons therein,
the second resistance varying region having an impurity concentration that is lower than an impurity concentration of the second diffusion region; and
a second electric charge accumulating layer on the second resistance varying region and another outer peripheral sidewall of the control electrode, that accumulates electric charge from the trapped electrons in the second resistance varying region, the trapped electrons injected into the first electric charge accumulating layer by hot carriers.

16. The non-volatile memory of claim 15, further comprising:
a first sub-electrode on the first charge accumulating layer; and
a second sub-electrode on the second charge accumulating layer.

17. The non-volatile memory of claim 16, wherein the first and second sub-electrodes are continuous with each other and include an extension portion over the control electrode.

18. The non-volatile memory of claim 17, wherein a second insulating film is between the control electrode and the extension portion of the first and second sub-electrodes.

19. The non-volatile memory of claim 14, further comprising a resistance varying sub-region in the substrate between the first resistance varying region and the control electrode, the resistance varying sub-region having an impurity concentration lower than the impurity concentration of the first resistance varying region.

20. The non-volatile memory of claim 14, wherein the first electric charge accumulating layer comprises in order a first oxide film, an intermediate film, and a second oxide film, and
the intermediate film comprises one or more insulating films selected from the group consisting of a silicon nitride film, an aluminum oxide film and a hafnium oxide film.

21. The non-volatile memory of claim 15, further comprising a resistance varying sub-region in the substrate between the second resistance varying region and the control electrode, the resistance varying sub-region having an impurity concentration lower than the impurity concentration of the first resistance varying region.

22. The non-volatile memory of claim 15, wherein the second electric charge accumulating layer comprises in order a first oxide film, an intermediate film, and a second oxide film, and
the intermediate film comprises one or more insulating films selected from the group consisting of a silicon nitride film, an aluminum oxide film and a hafnium oxide film.

* * * * *